(12) United States Patent
Utzny et al.

(10) Patent No.: US 9,405,185 B2
(45) Date of Patent: Aug. 2, 2016

(54) SHAPE METROLOGY FOR PHOTOMASKS

(71) Applicant: Advanced Mask Technology Center GmbH & Co. KG, Dresden (DE)

(72) Inventors: Clemens Utzny, Dresden (DE); Markus Bender, Dresden (DE); Christian Buergel, Langebrueck (DE); Albrecht Ullrich, Dresden (DE)

(73) Assignee: Advanced Mask Technology Center GmbH & Co. KG, Dresden (DE)

( * ) Notice: Subject to any disclaimer, the term of this patent is extended or adjusted under 35 U.S.C. 154(b) by 18 days.

(21) Appl. No.: 14/246,645

(22) Filed: Apr. 7, 2014

(65) Prior Publication Data

US 2015/0286130 A1  Oct. 8, 2015

(51) Int. Cl.
*G03F 1/36* (2012.01)
*G03F 1/44* (2012.01)
*G01B 11/02* (2006.01)
*G01F 1/44* (2006.01)

(52) U.S. Cl.
CPC  *G03F 1/36* (2013.01); *G01B 11/02* (2013.01); *G01F 1/44* (2013.01)

(58) Field of Classification Search
CPC ............ G03F 1/36; G03F 1/144; G01B 11/02
USPC ........................................................ 430/5, 30
See application file for complete search history.

(56) References Cited

U.S. PATENT DOCUMENTS

2003/0233630 A1\* 12/2003 Sandstrom .............. G03F 1/144
716/50

\* cited by examiner

*Primary Examiner* — Christopher Young
(74) *Attorney, Agent, or Firm* — Dicke, Billig & Czaja, PLLC

(57) ABSTRACT

A method of manufacturing a photomask includes forming a mask pattern with a critical mask feature on a photomask. Shape information which is descriptive for an outline of the critical mask feature is obtained from the photomask. The shape information contains position information identifying the positions of landmarks on the outline relative to each other. The landmarks may indicate local curvature extrema, points of inflexion, sharp bends in the curvature and/or local curvature-change maxima in the outline of the mask feature, respectively. The shape information may enable a shape metrology which is not completely based on rectangular approximations of mask features.

13 Claims, 13 Drawing Sheets

SHAPE METROLOGY FOR PHOTOMASKS

BACKGROUND

The manufacturing of semiconductor devices includes the transfer of patterns into the semiconductor wafer in a photolithography process. Shortwave radiation from a laser source passes a photomask or is reflected at a photomask and incidents on a photosensitive layer on the semiconductor wafer. The pattern of the photomask defines the pattern on the semiconductor wafer. There is a need to supply semiconductor manufacturers with photomasks reliably fulfilling imaging specifications with respect to the imaged patterns.

SUMMARY

According to an embodiment a method of manufacturing a photomask includes forming a mask pattern that includes a critical mask feature on a photomask. Shape information which is descriptive for an outline of the critical mask feature is obtained from the photomask. The shape information contains position information identifying the positions of landmarks on the outline relative to each other.

According to another embodiment, a photomask package includes a photomask with a critical mask feature as well as shape information descriptive for an outline of the critical mask feature on the photomask. The shape information contains position information identifying the positions of landmarks on the outline relative to each other.

According to a further embodiment, a method for evaluating a photomask includes obtaining shape information descriptive for an outline of a critical mask feature on the photomask. The shape information contains position information identifying the positions of landmarks on the outline relative to each other. The landmarks indicate at least one of local curvature extrema, points of inflexion, sharp bends in the curvature and local curvature-change maxima in the outline of the critical mask feature, respectively.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated, as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" are open and the terms indicate the presence of stated structures, elements or features but not preclude additional elements or features. The articles "a", "an" and "the" are intended to include the plural as well as the singular, unless the context clearly indicates otherwise.

Figure 1A:
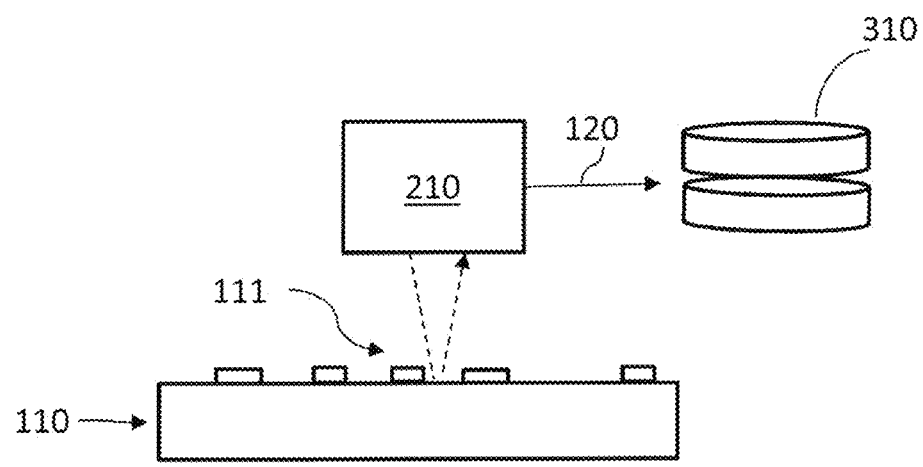
FIG. 1A is a schematic diagram of an appliance including a semiconductor wafer for illustrating a method of manufacturing a photomask according to an embodiment.

FIG. 1A shows a photomask 110 including a mask pattern with one or more critical mask features 111. The photomask 110 may be a reflective mask with the mask pattern formed by absorbent and reflective sections or a transparent mask with the mask pattern including transparent and opaque sections. The critical feature 111 may be a reflective or absorbent feature on a reflective mask or an opaque or transparent feature in a transparent mask.

An inspection unit 210 retrieves shape information 120 of at least one critical mask feature 111 from the photomask 110 and transfers the shape information 120 to a data storage unit 310. The shape information 120 contains information about the outline (contour) of the critical feature 111. The shape information 120 may contain position information of prominent points (landmarks) on the outline, wherein at least one or some of the landmarks are not assignable to a rectangular approximation of the mask feature. From the position information of the landmarks both more precise areal information of the critical feature 111 on the photomask 110 and details descriptive for a type of contour deviation from the target outline may be obtained.

Conventionally, information descriptive for a photomask may contain statistical CD (critical dimension) information about a minimum width, mean width and maximum width of the critical feature 111 along one lateral axis or along two orthogonal lateral axes. By contrast, the shape information 120 according to the embodiments may contain statistical information descriptive for the deviation of the contour of the critical mask feature 111 from a target contour with respect to more than two horizontal axes. While conventional CD information may describe the deviation of a size of a rectangular approximation of an actual mask feature from the size of a rectangular target feature, the shape information 120 describes the deviation of an outline of the mask feature from the outline of the a mean mask feature or a target feature. An area of the critical mask feature can be more precisely calculated on the basis of the shape information 120 than on the basis of a rectangular approximation. The shape information 120 may contain information describing a type and degree of shape variation such as edge bowing, line shortening, and/or corner rounding, by way of example. In addition the shape information 120 may include statistical information of variation patterns descriptive for the type and degree of a deviation of the outlines of mask features from a mean shape of a plurality of mask features corresponding to the same target feature.

As regards lines of closely spaced contacts information concerning a distance between the contacts along the contact line may be more relevant than the information about how the contacts expand or shrink along the direction perpendicular to the contact line. According to an embodiment, the critical mask feature 111 may be a line of isolated mask features resulting from a line of isolated square target features, or the spaces therebetween. Another critical feature may be given by two adjacent lines with rectangular bulges opposite to each other, where the line fitting approximation relies on only few values because the fitting process neglects sample points close to the edges of the bulges and the absolute number of sample points is low. Instead, with the shape information 120 the critical feature can be characterized by more and/or more significant sample points allowing a precise estimation of whether or not the photomask may be used for the intended purpose.

Figure 1B:
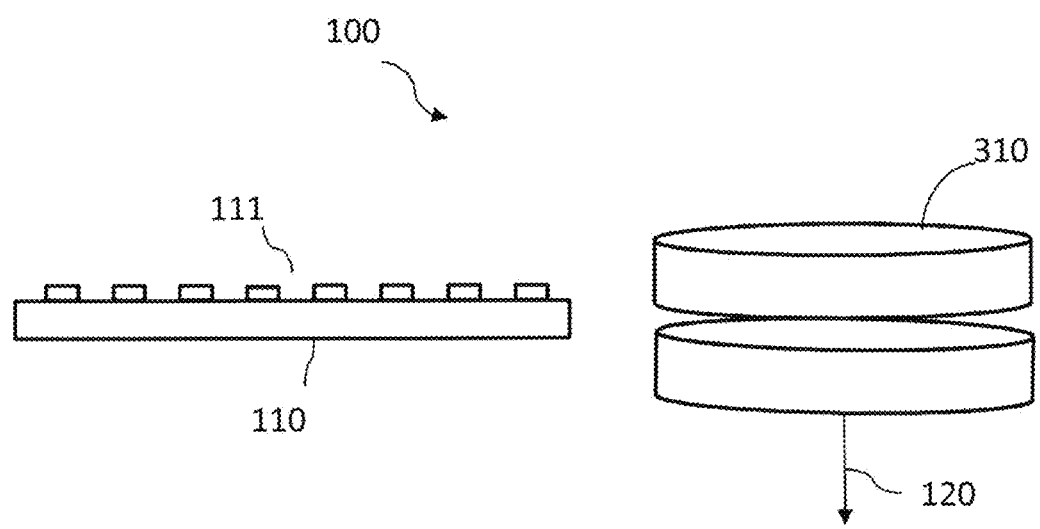
FIG. 1B is a schematic diagram showing a photomask package according to a further embodiment.

The method provides a photomask package 100 including the photomask 110 and the shape information 120 to a user as illustrated in FIG. 1B. The data storage unit 310 may be any kind of portable data carrier or a server accessible for the user of the photomask 110. The user of the photomask 110 may access the data storage unit 310 to obtain the shape information 120 for critical mask features 111 and to control an illumination process using the photomask 110 by adapting an illumination parameter, e.g. a defocus and/or illumination intensity, according to the shape information 120.

Figure 1C:
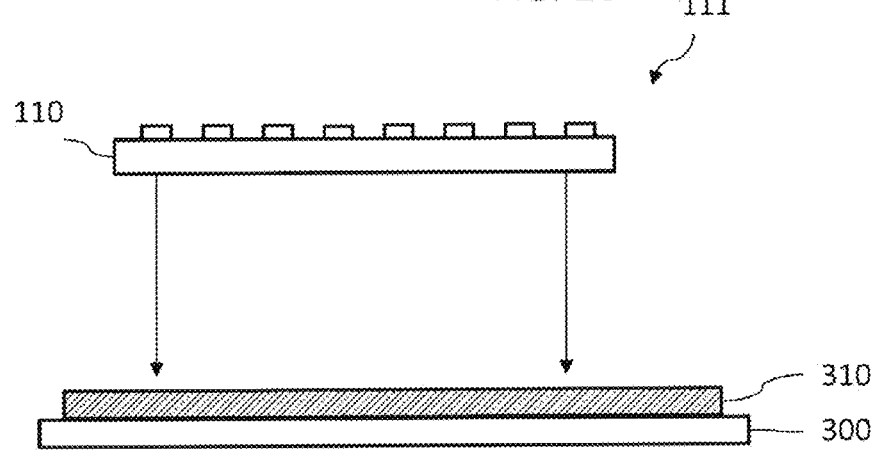
FIG. 1C is a schematic diagram of an appliance including a photomask and a semiconductor wafer for illustrating a method of manufacturing semiconductor devices using a photomask in accordance with a further embodiment.

According to another embodiment the shape information 120 may be compared with target shape information of the concerned critical features 111. The result of the comparison may be used to discard or rework photomasks 110 that do not fulfil specifications set up by the user of the photomask 110. If the shape information 120 complies with the target shape information, a process for manufacturing semiconductor devices or micro electromechanical systems may use the photomask 110 to transfer the mask pattern into a radiation sensitive layer, e.g., a photoresist layer 310 on a semiconductor wafer 300 as illustrated in FIG. 1C.

Figure 1D:
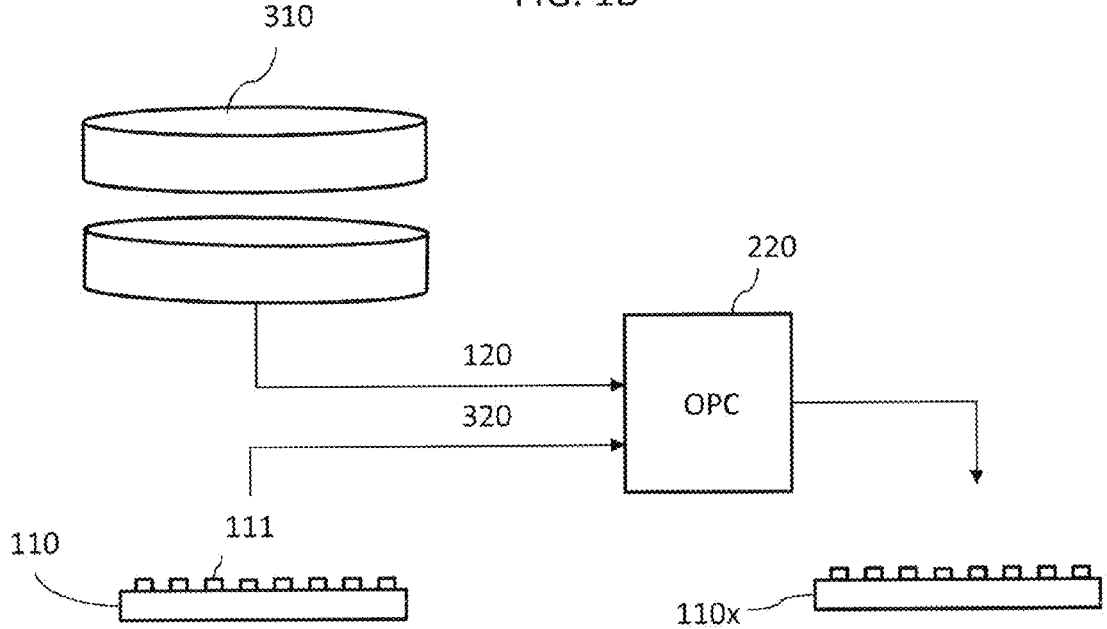
FIG. 1D is a schematic diagram of an appliance based on a photomask package and including a semiconductor wafer for illustrating a method of manufacturing semiconductor devices according to an embodiment related to OPC (optical proximity correction) using shape information of critical features on a photomask.

According to a further embodiment illustrated in FIG. 1D, an optical proximity correction unit 220 may combine the shape information 120 about the critical features 111 of a mask pattern and layout data 320 describing the mask pattern of a photomask 110 in an extended optical proximity correction algorithm. The extended optical proximity correction algorithm may calculate optical proximity features using the shape information 120 such that a further photomask 110x with updated optical proximity features can be obtained that more precisely fulfils the photomask specifications and the requirements of a target lithography process. The process may be reiterated to further improve the imaging properties.

Compared to conventional approaches, which obtain and evaluate rectangular approximations of critical features 111, the shape information 120 more precisely expresses whether or not the photomask 110 fulfils the requirements of a target lithography process. In addition, the shape information 120 provides more reliable information about further critical properties of the mask features such as area and minimum width of critical mask features 111 as well as minimum distances between selected mask features.

Figure 2A:
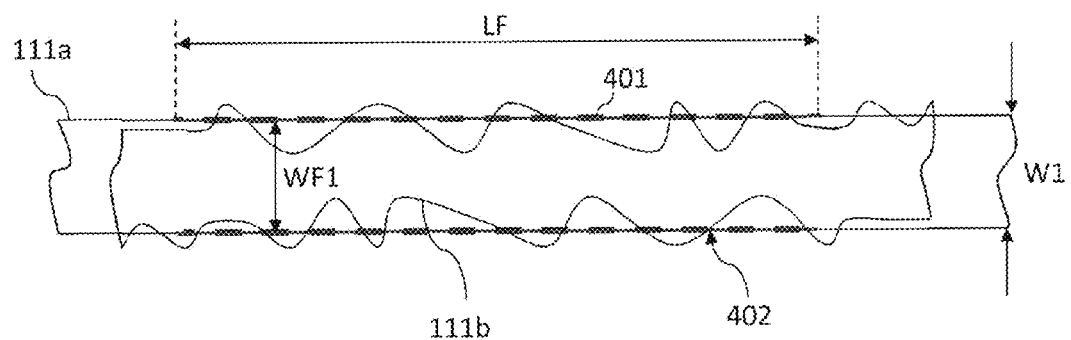
FIG. 2A is a schematic diagram of a mask feature for illustrating the specification of mask features by fitting long parallel lines for discussing effects of the embodiments.
Figure 2B:
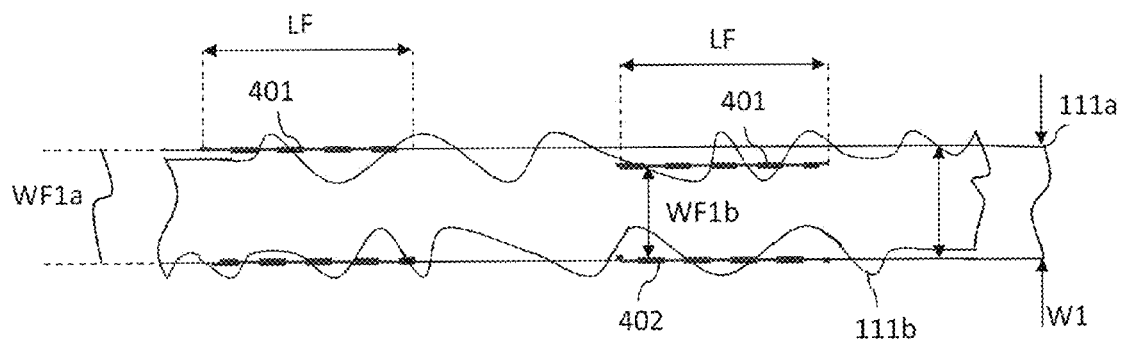
FIG. 2B is a schematic diagram of a mask feature for illustrating the specification of mask features by fitting short parallel lines for discussing effects of the embodiments.

FIGS. 2A and 2B refer to a line 111a as an example for a critical mask feature. The target shape of the line 111a is a rectangle with a target line width W1. Due to process imperfections and proximity effects the corresponding actual shape 111b on the photomask is not rectangular but may be rounded, distorted and shortened and the line edges may be undulated instead of straight. Typically, an average width of the actual shape 111 on the photomask is estimated for deciding whether the photomask fulfils a given specification. For this purpose, an optical measurement apparatus uses a line fitting approach that approximates the distorted line edges by two parallel auxiliary lines 401, 402 and then outputs the distance between the two auxiliary lines 401, 402 as an estimation for an average line width WF1. A plurality of critical features on the photomask may be evaluated, for example, for deciding whether or not the photomask fulfils predefined requirements concerning CDU (critical dimension uniformity).

The auxiliary lines 401, 402 average the respective edges of the actual line 111b within a measurement window with a window length LF. When the target line width W1 is in the range of the absolute critical dimensions for the photomask, the fitting of the two parallel auxiliary lines 401, 402 for obtaining an approximation of the actual average line width WF1 of critical mask features depends on the window length LF.

In FIG. 2A the auxiliary lines 401, 402 are comparatively long and the result of the line fitting may pretend a sufficiently wide approximated average line width WF1 though the distortions may locally reduce the actual line width significantly to below the approximated average line width WF1.

In case the line 111a corresponds to a connection line, the resistivity of the connection line strongly depends on the contour of the line 111a. Though the result of a line fitting approach may pretend that the line 111a fulfils a given width criterion, a conductive line obtained from the line 111a by a lithography process using the photomask with the line 111a may have a higher resistance than desired. In addition, resist fins obtained by developing the photo sensitive film after exposure may tend to collapse where the actual line width is significantly narrower than the approximated average line width WF1.

As shown in FIG. 2B, the measurement window for the line-fitting approach may have a smaller window length LF to get more relevant information on the line width W1 using shorter auxiliary lines 411, 412. The smaller window length LF results in position-dependent approximations WF1a, WF1b for the average line width. The fitting algorithm needs a sufficient large number of points along the actual line 111b to work, hence, a sufficiently long measurement window. But a long measurement window may conceal that the actual line width locally falls below a critical threshold within the measurement window LF.

Figure 3A:
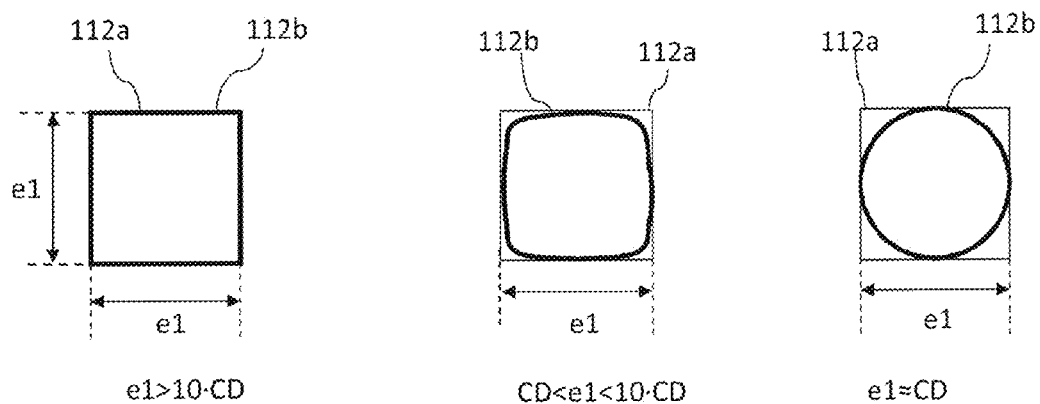
FIG. 3A is a schematic diagram showing corner rounding as an example for shape variations for discussing effects of the embodiments.

FIG. 3A shows the effect of corner rounding. The target feature 112a is a square and may correspond to contact pads or openings for contact vias in a target substrate such as a semiconductor wafer. At edge lengths e1 greater than ten times the critical feature size CD of the respective mask, the shape of the actual mask feature 112b appears nearly undistorted with regard to the target feature 112a as illustrated on the left hand side. At an edge length e1 approximating the critical feature size CD, the corners of the actual mask feature 112b get increasingly rounded as illustrated in the central image. At an edge length e1 close to the critical feature size CD, the actual mask feature 112b approximates a circle as illustrated on the right hand side.

Figure 3B:
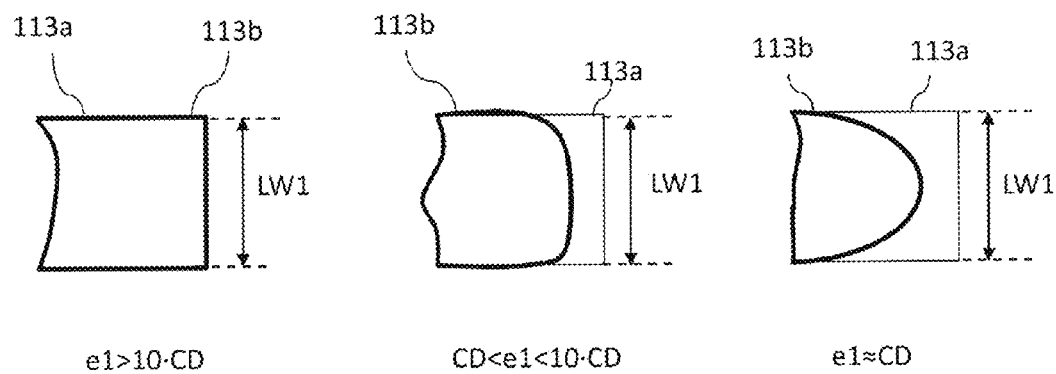
FIG. 3B is a schematic diagram showing end shortening as an example for shape variations for discussing effects of the embodiments.

FIG. 3B shows the effect of corner rounding at line end portions. The target feature is a line 113a that may correspond to a connection line or a line trench in a target substrate such as a semiconductor wafer. At line widths LW1 greater than ten times the critical feature size CD of the respective mask, the shape of the actual line 113b appears nearly undistorted with regard to the target line 113a as illustrated on the left hand side. At a line width LW1 approximating the critical feature size CD, the line end portion of the actual line 113b gets increasingly shortened as illustrated in the central image. At a line width LW1 close to the critical feature size CD, the corresponding actual line 113b is significantly shortened and completely bowed as illustrated on the right hand side.

Figure 3C:
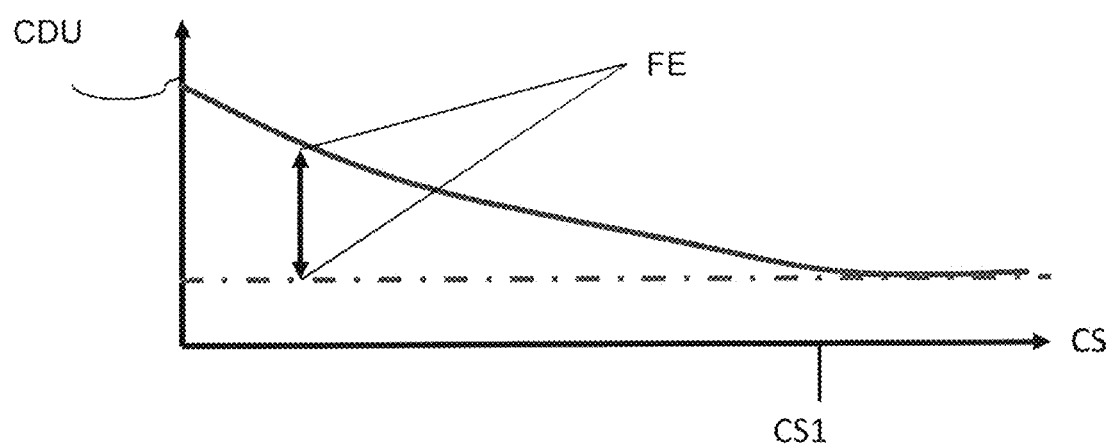
FIG. 3C is a schematic diagram plotting a fitting error against the contact size for discussing effects of the embodiments.

FIG. 3C shows a diagram plotting the CDU (critical dimension uniformity) against a contact size CS when using straight line fit, wherein a high CDU value indicates a high pattern variability. Below a certain contact size CS 1 the fitting error FE increases the critical dimension uniformity and dominates the assessment of size variation.

Figure 4A:
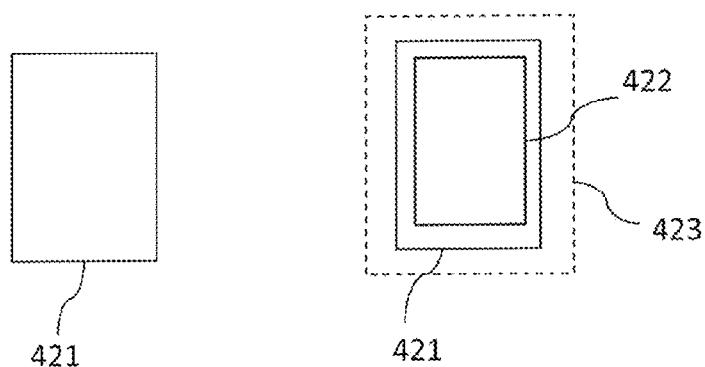
FIG. 4A is a schematic diagram showing contact outlines for illustrating conventional contact metrology and discussing effects of the embodiments.

FIG. 4A summarizes conventional contact metrology as an example for the application of conventional line fitting approaches. The conventional contact metrology assumes that the actual shape of the mask feature matches a target design 421, which may be a rectangle as illustrated on the left hand side. Two orthogonal line fitting processes approximate the distance between the two pairs of opposing edges. The result is a pure scaling information describing a difference between the area of the target design 421 and the approximated areas 422, 423 given by the approximated lines edges as illustrated in the centre. In addition, mask features used in the context of SMO (source mask optimization) approaches may intentionally contain non-trivial mask features whose shapes are not based on straight, orthogonal lines. The line fitting approach approximates such mask features with rectangular patterns.

Figure 4B:
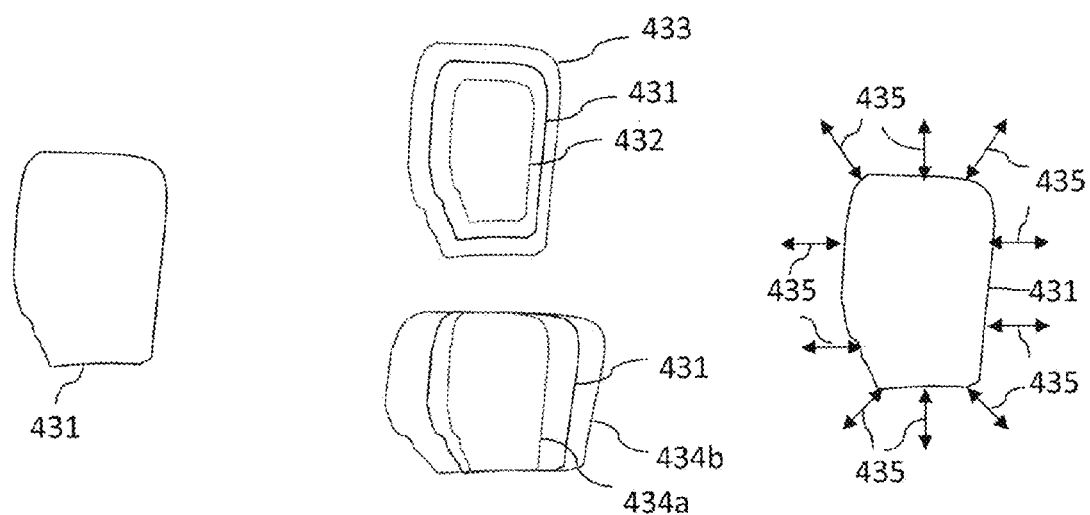
FIG. 4B is a schematic diagram showing contact outlines for illustrating a contact shape metrology according to an embodiment.

FIG. 4B illustrates a contact shape metrology based on the shape information 120 of FIGS. 1A to 1D. A mean shape 431 illustrated on the left hand side is computed from a plurality of mask features based on the same target feature. The target feature may be a rectangle or a non-trivial mask feature without straight edges. The mean shape 431 may correspond to one single target feature or a set of identical target features. Then variation patterns may be evaluated that describe the differences between single mask features and the mean shape 431. The variation patterns may include information on the type of variation, for example rotation, scaling, and/or specific corner/edge distortion.

The upper illustration in the centre of FIG. 4B shows scaled shapes 432, 433 resulting from the mean shape 431 by isotropic scaling. The variation pattern is isotropic scaling and the shape information may include information descriptive for the position of points on the outline of the mean shape 431 as well as an isotropic scaling factor. Further in the centre, FIG. 4B shows shapes 434a, 434b resulting from a variation pattern based on one-dimensional scaling of the mean shape 431, wherein the scaling factor may depend on the direction of the scaling. Instead of or in addition to isotropic or one-dimensional scaling factors, the type of variation pattern may be rotation, specific corner distortion, and/or specific edge distortion and the shaping information may include information identifying the type of variation pattern as well as information identifying the scale of the respective variation pattern.

On the right hand side FIG. 4B illustrates local vectors 435 assigned to specific points on the contour of the mean shape 431. Modifications of the mean shape 431 can be expressed by assigning to each local vector 435 a length and a direction. The shape information may include information descriptive for the position of points on the outline of the mean shape 431 as well as statistical information about position, length and direction of the local vectors 435, the latter being descriptive for the variation pattern.

Prominent points on the outlines of the mean shape and the mask features are selected to describe the mean shape 431 and may serve as bases for the description of the variation patterns using the local vectors 435. The points include first landmarks (mathematical landmarks) and may further include, if applicable, second landmarks (interpolated or constructed landmarks). The first landmarks are defined by a geometric property of the outline at the concerned landmark. For example, the first landmarks may indicate at least one of local curvature maxima, local curvature minima, extreme points and points of inflexion, by way of example. The position of a second landmark on the outline does not directly indicate a specific geometric property of the concerned outline but is derived from the position of the first landmarks.

On the basis of their geometrical properties, a landmark recovery process identifies the first landmarks on the actual mask features and calculates a mean shape with respective mean positions of corresponding landmarks. A variation pattern included in the shape information may describe how the positions of the landmarks relative to each other change between the calculated mean shape and the respective actual mask features. The variation patterns may be described by the principal components of a PCA on the basis of a plurality of mask features obtained from the same target feature on different mask positions and/or differently scaled target features.

Figure 5A:
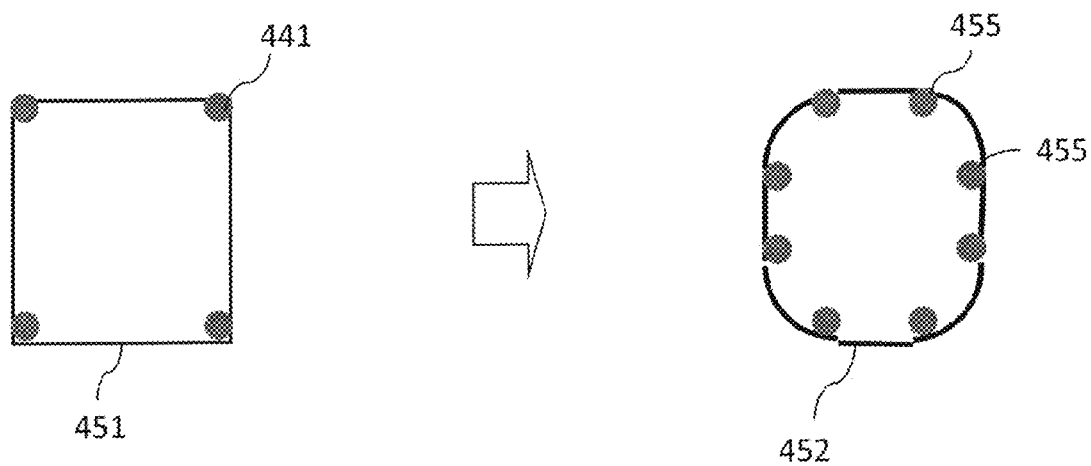
FIG. 5A is a schematic plan view of a square target feature and a corresponding mask feature for illustrating the selection of first landmarks according to an embodiment.

FIG. 5A refers to first landmarks on mask features resulting from square target features that may be intentionally non rectangular mask features. On the left hand side FIG. 5A shows first target landmarks 441 located in the corners of a square target feature 451. On the outline of a corresponding actual mask feature 452 a landmark recovery process may identify first image landmarks 455 that may correspond to the first target landmarks 441 with respect to their geometric properties. A correspondence between the first target landmarks 441 and the first image landmarks 455 may be a one-to-one correspondence.

For the illustrated example, two first image landmarks 455 on the actual mask feature or mean shape 452 are assigned to each of the first target landmarks 441, respectively, as illustrated on the right hand side of FIG. 5A. On the outline of a corner-rounded mask feature the first image landmarks 455 may be identified at transitions points between straight and bowed sections or at points, where a first or second derivative of a positional function defined in a Cartesian coordinate system aligned to the edges of the target feature 451 has a sharp bend, a step or a local extremum.

Figure 5B:
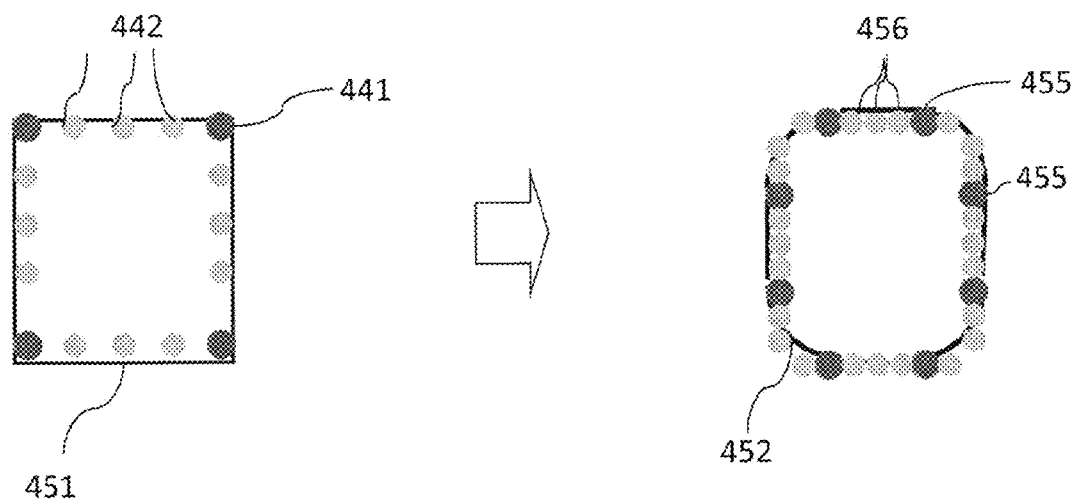
FIG. 5B is a schematic plan view of a square target feature and a corresponding mask feature for illustrating the selection of second landmarks according to another embodiment.

FIG. 5B refers to embodiments for the selection of second landmarks on mask features resulting from square target features that may be intentionally non rectangular mask features. The positions of the second target landmarks 442 are derived from the positions of the first target landmarks 441. On the left hand side groups of second target landmarks 442 are located between two neighboring first target landmarks 441 of a square target feature 451, respectively. The number of second target landmarks 442 between two first target landmarks 441 may vary, e.g., may be a function of the distance between the two concerned first target landmarks 441. According to the illustrated embodiment, the number of second target landmarks 442 is the same between each pair of neighboring first target landmarks 441. The distance between second target landmarks 442 assigned to the same group and to the respective first target landmarks 441 may vary. According to the illustrated embodiment, the first and second target landmarks 441, 442 are equidistant on the target feature 451.

The landmark recovery process may identify second image landmarks 456 that may correspond to the second target landmarks 442 with respect to their relative position to each other. For example, after identifying the first image landmarks 455, the landmark recovery process may divide an outline section between neighboring first image landmarks 455 assigned to different first target landmarks 441 into equidistant portions according to the number of second target landmarks 442 in the concerned outlined section. The correspondence between the second target landmarks 442 and the second image landmarks 456 may be a one-to-one correspondence.

Figure 5C:
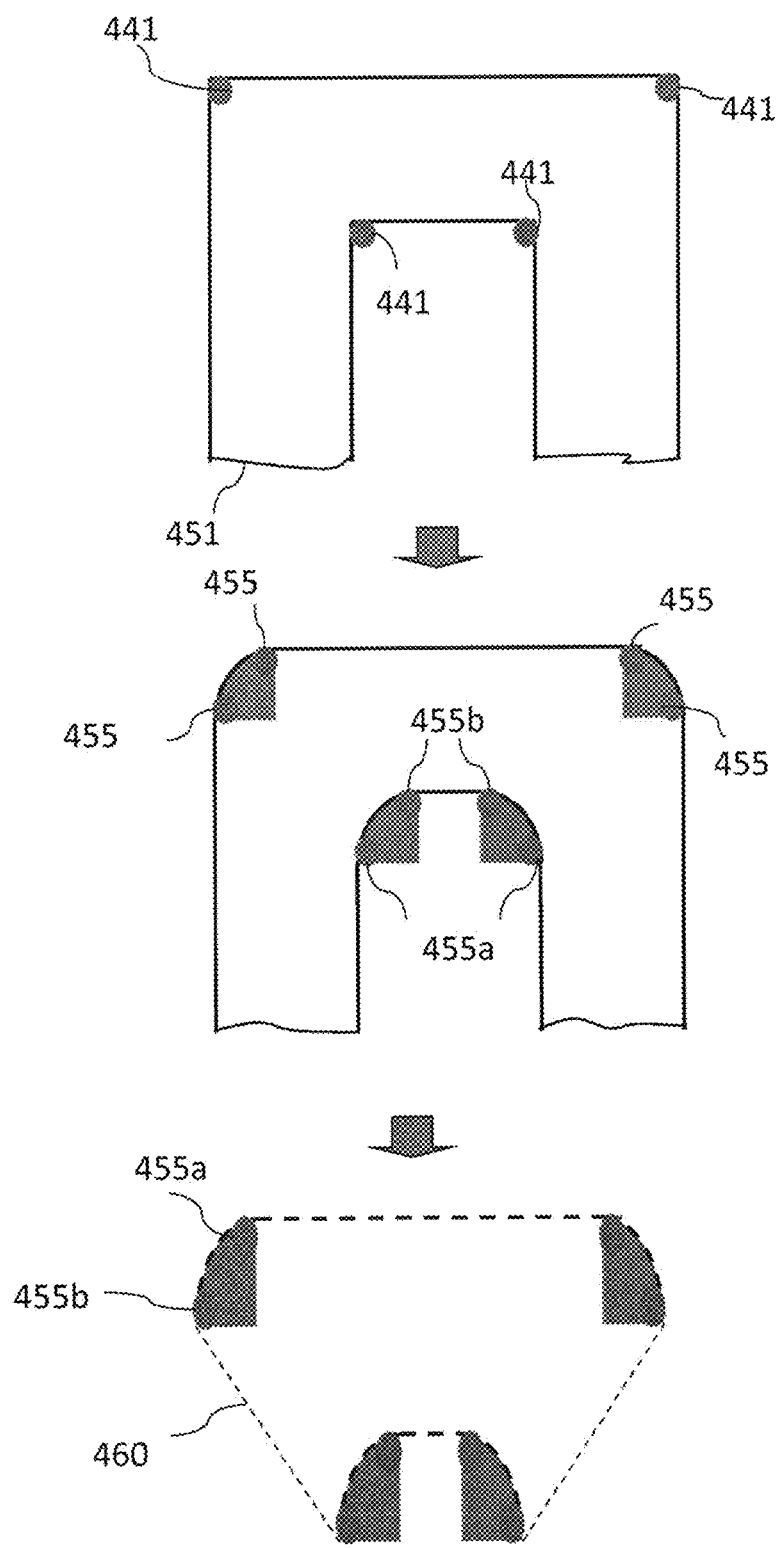
FIG. 5C is a schematic plan view of a U-shaped target feature for illustrating the selection of landmarks according to a further embodiment concerning U-shaped patterns.

The target features may be squares or rectangles with or without rounded corners, stripes, ovals, non-trivial mask features without straight edges or more complex structures such as specific line patterns. In FIG. 5C the target feature 451 is a portion of a U-shaped line as illustrated on the top of FIG. 5C. The corners may define the first target landmarks 441. The landmark recovery process identifies the first image landmarks 455 as illustrated in the center. A further evaluation may be based only on the relative position of the first image landmarks 455 in a region of interest 460 as illustrated at the bottom of FIG. 5C and the corresponding variation pattern, whereas further shape information as regards the target feature 451 outside the region of interest 460 may be neglected or discarded.

Critical features evaluated in conventional approaches like line fitting are typically provided as test patterns in non-producing portions of the photomask. But shape deviations like edge variation and contact rounding depend on the context of the concerned feature. Therefore photomasks that do fulfill the specification with regard to the test patterns might fail at the user side because the test pattern is not appropriate to give enough information about critical areas within the producing mask portions. Other photomasks may not fulfill the specifications for the test pattern but would fulfill user's requirements within the producing mask portion.

In addition, line fitting appears not to be appropriate where the basic assumption of pattern fidelity, e.g. that the actual mask features for rectangular target features are rectangular does not fit and where shape variations become dominant.

Instead, the shape information gives to the user more relevant information on how the features on the mask behave and how the features are imaged into a target substrate.

Assumed a previously approved process for manufacturing a photomask is changed, e.g. by changing a developer solution. Even if the new process results in photomasks fulfilling the specification as regards a test pattern, there is still some risk that the new process does not fit for specific structures in the producing portion of the photomask. Since the method according to the embodiments may compare more detailed shape information on features in the producing portions of the photomasks obtained by the old and new processes, respectively, the risk for delivering not-approvable photomasks is significantly reduced when a parameter of the manufacture process changes.

Figure 6:
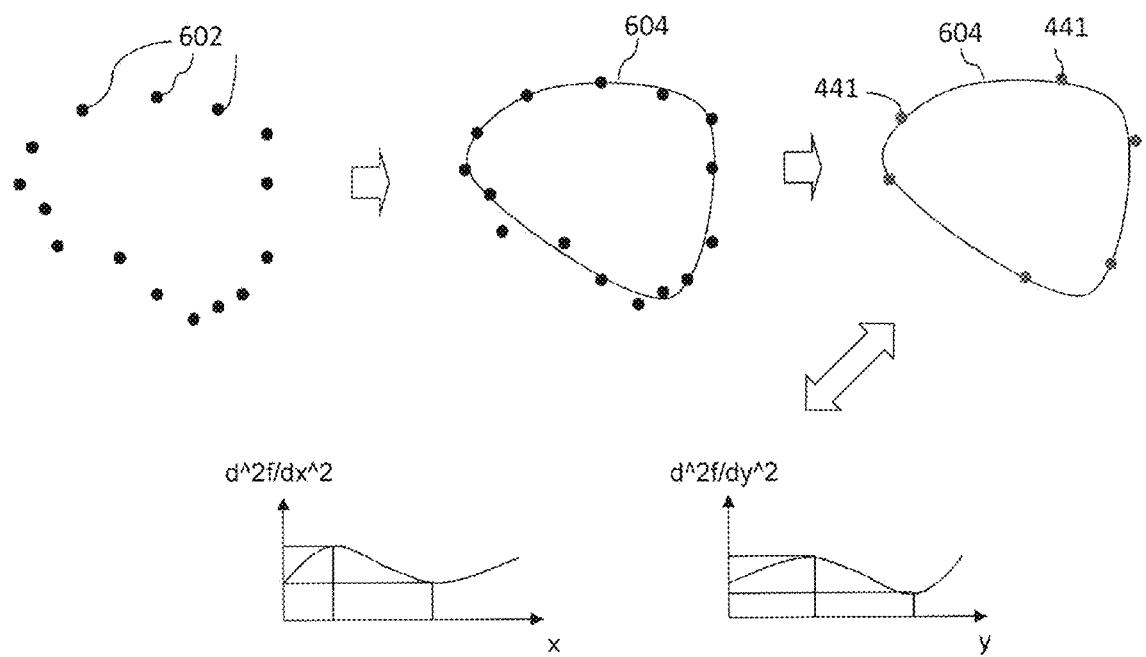
FIG. 6 is a schematic diagram illustrating the selection of landmarks according to a further embodiment.

FIG. 6 refers to a landmark recovery process which may identify first landmarks on the outline of actual mask features.

An optical device scans or images the photomask, e.g., by SEM (scanning electron microscopy). An edge detection process identifies the outlines of the photomask and may detect points 602 on the outline of a mask feature. An estimation process may approximate an outline estimation 604, which may be described as a positional function f(x,y) of two orthogonal coordinate values x, y using, e.g. a method minimizing a means square error of the points 602 with regard to the outline estimation 604 given by the positional function f(x,y). Local maximum and/or minimum values of the first and second derivations $d_2 f/dx^2$, $d_2 f/dy^2$ of the positional function may identify first image landmarks 441 where the outline and/or a concavity of the outline estimation 604 have local minima or local maxima. According to the illustrated embodiment first image landmarks are identified where second derivatives of the outline estimation 604 with respect to two orthogonal axes have local extrema, respectively.

With the knowledge about the position of the landmarks 441, 442 relative to each other and about the variation patterns describing direction and an amount of a displacement of the landmarks with respect to their mean positions, an evaluation program or evaluation unit may more precisely estimate, e.g., an area variation of the squared mask feature as well as minimum, mean and maximum distances of the actual mask features with respect to any lateral axis.

In a similar way, minimum widths of lines and minimum distances between neighbouring lines on the photomask can be more precisely defined. Photomasks, which according to conventional line-fitting approaches masks do fulfil a specification defined with regard to a test pattern can fail at the client side because either the test pattern is not appropriate to give enough information about critical areas within the producing mask area or the fitting algorithm loses critical information, for example on a minimum line width. On the other hand photomasks that do not fulfil the specifications obtained on the test pattern by conventional line fitting approaches may nevertheless fulfil client's requirements within the producing mask area, for example where the line fitting algorithm indicates smaller contact areas than actually provided by the mask.

Using the shape information more masks with critical line deviations can be discarded or reworked at an early stage of the process and more masks that are actually suitable for manufacturing semiconductor devices can be saved from falsely being discarded. The shape metrology increases efficiency in the field of photomask manufacture. In addition, the shape metrology according to the embodiment may handle non-trivial mask features. The methods of statistical shape analysis can be used for CD analysis, contact area analysis etc. Shape changes can be classified, quantified and measured.

Figure 7A:
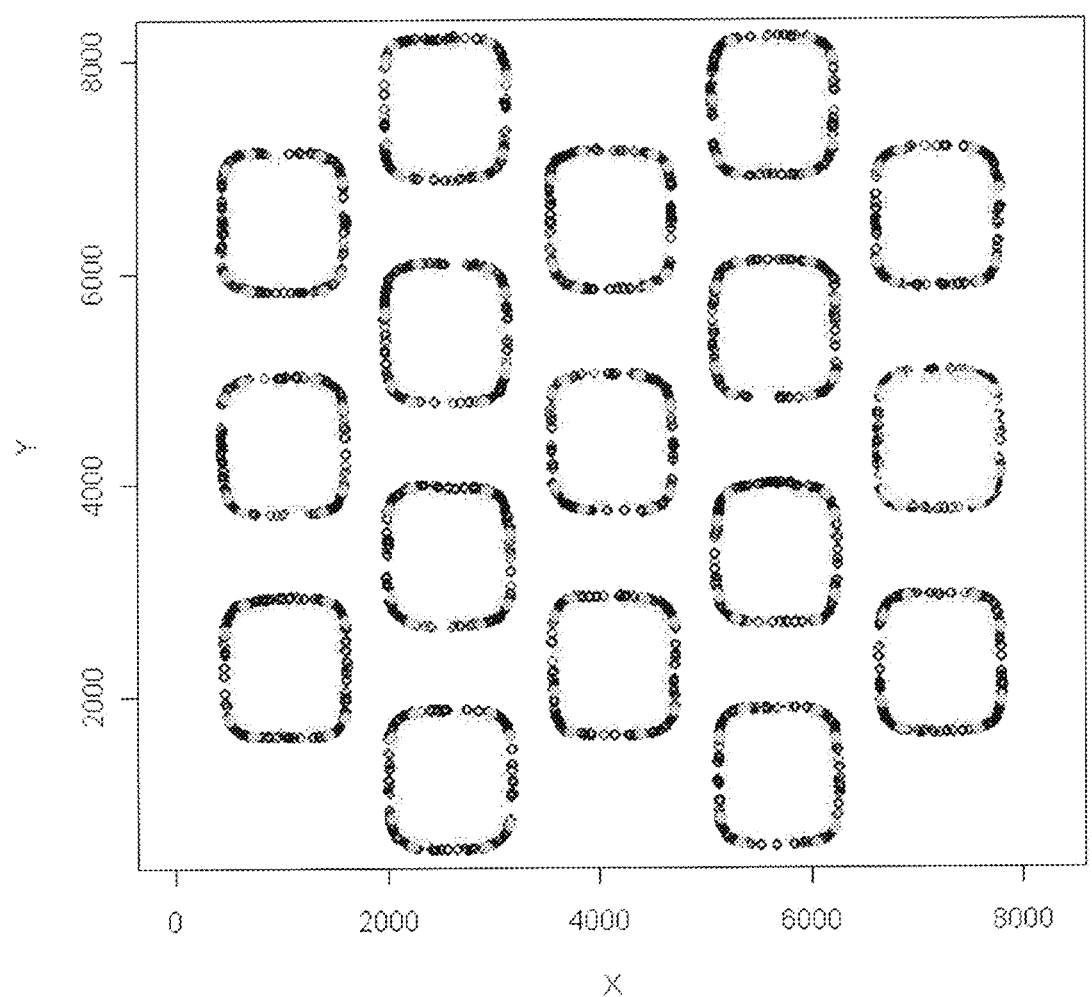
FIG. 7A is a schematic plan view of a field of mask features corresponding to square target features for contact pads for discussing effects of the embodiments.

FIG. 7A refers to local contact uniformity and shows a group of mask features that may correspond to a group of square target features described in source layout data of the photomask, wherein the target features have identical dimensions. A landmark recovery process may recover the positions of the image landmarks in each of the mask features. The position information about corresponding image landmarks in the actual square mask features may be combined, respectively, and a set of combined image landmark information may provide position information about mean image landmarks on the outline of a mean shape of the mask features.

Figure 7B:
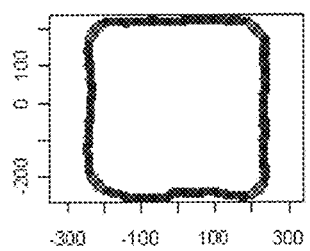
FIG. 7B is a schematic plan view of a set of diagrams showing a field of mask features corresponding to square target features for contact pads for discussing effects of the embodiments on contact linearity.
Figure 7B:
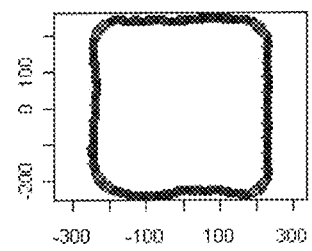
Figure 7B:
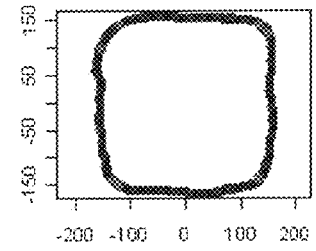
Figure 7B:
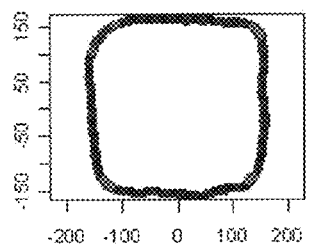
Figure 7B:
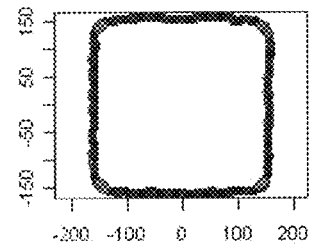
Figure 7B:
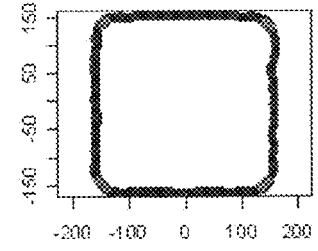
Figure 7B:
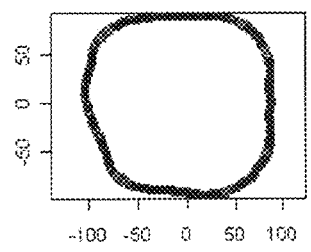
Figure 7B:
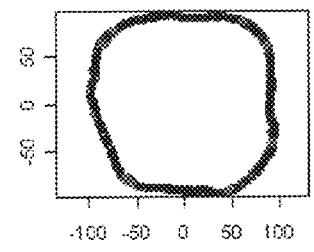
Figure 7B:
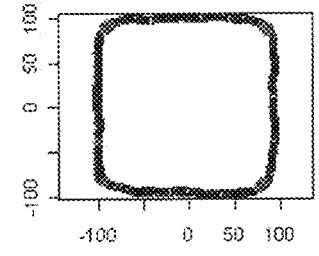

FIG. 7B refers to contact linearity and shows three sets of mask features that may correspond to three sets of square target features of different size described in source layout data of the photomask. A landmark recovery process recovers positions of the image landmarks in each of the mask features.

A PCA (principal component analysis) may be performed for each set of corresponding landmarks. The PCA converts the position deviations of corresponding landmarks into a set of values of linearly uncorrelated principal components.

Figure 7C:
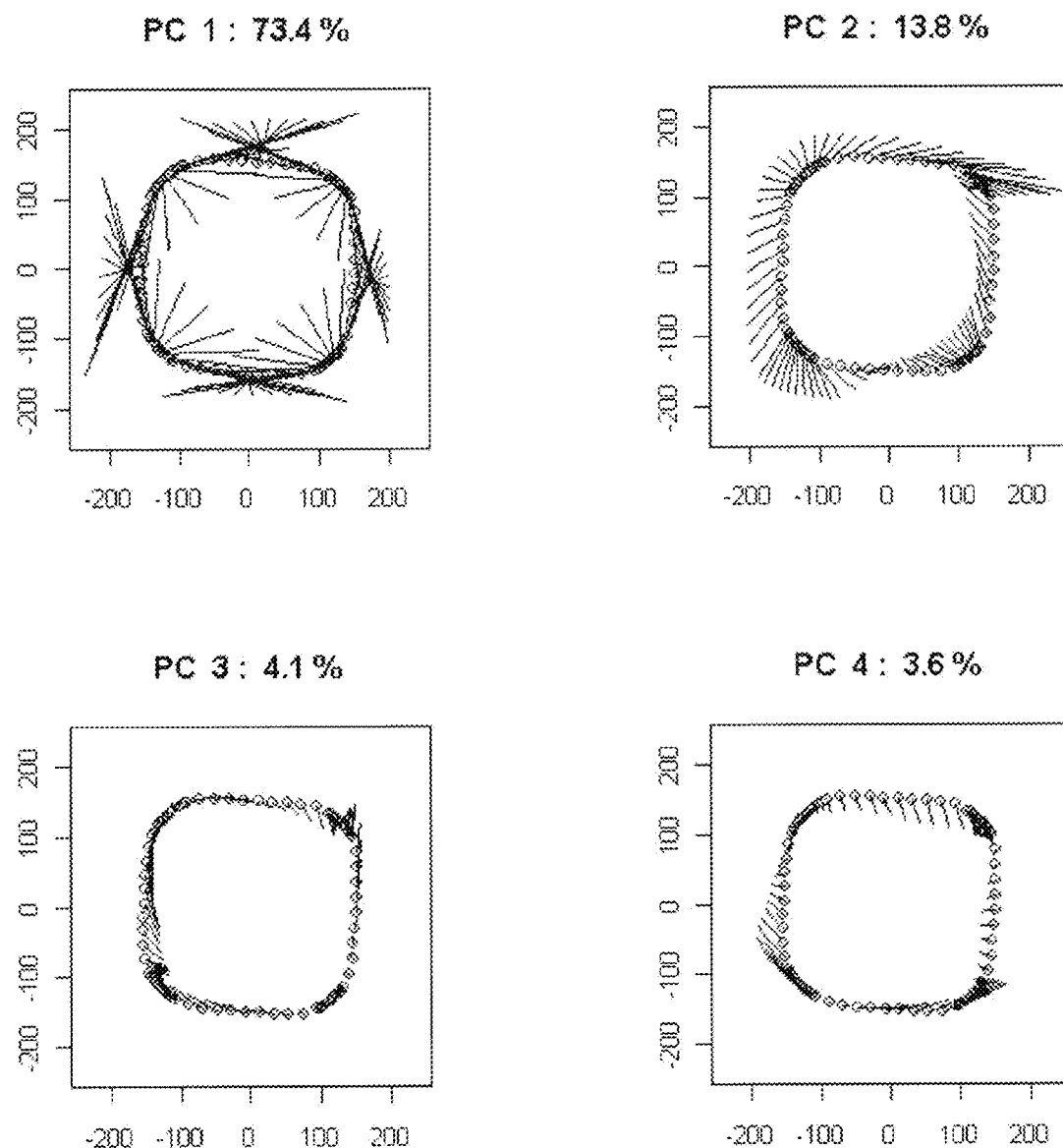
FIG. 7C is a schematic plan view of a set of diagrams showing results of a PCA (principal component analysis) of the mask features of FIG. 7B.

FIG. 7C shows the result of the PCA for the data set of FIG. 7B. The measures obtained by SEM may be used to calibrate the average area of the mask features. For example, a normalized centroid size $NS(x)$ may be given by equation (1).

$$NS(x) = \frac{\sqrt{\sum_{i=1}^{k} \sum_{j=1}^{m} (x_{ij} - \langle x_j \rangle)^2}}{\sqrt{km}} \quad (1)$$

In equation (1), k is the number of landmarks and m the number of dimensions. The mean shape and the variations of the mask features may be computed based on minimizing the square distance of the mean shape or maximizing the likelihood of the mean shape, by way of example.

If the data describing the outline of the mask features is available in the form according to equation (2).

$$w_i = \gamma_i 1_k + \beta_i \exp(i\theta_i)(\mu + \epsilon_i) \; i=1,\ldots,n \quad (2)$$

With $w_i$ indicating the vector of one pattern realization, $\gamma_i$ indicating the translation, $1_k$ indicating a unit k×k matrix, $\beta_i$ indicating the scaling, $\theta_i$ indicating the rotation, $\mu$ indicating the population mean configuration and $\epsilon_i$ indicating an uncorrelated normal distributed residual, the mean shape $[\mu]$ is found by equation (3).

$$[\mu] = \arg\inf_{\mu} \Sigma_i^n d^2(w_i, \mu) \quad (3)$$

In (3) d is the distance measure and $\mu$ is an unknown unit size mean configuration.

Differences between the mean image landmarks and the respective actual image landmarks along the outlines of the actual square mask features deliver statistical information from which the behavior of further mask features may be estimated. A variation pattern given by the differences between the mean image landmarks and the landmarks in the target feature delivers information of a variation pattern and/or variation degree descriptive for the sort and/or degree of deviation from the target features.

Figure 8:
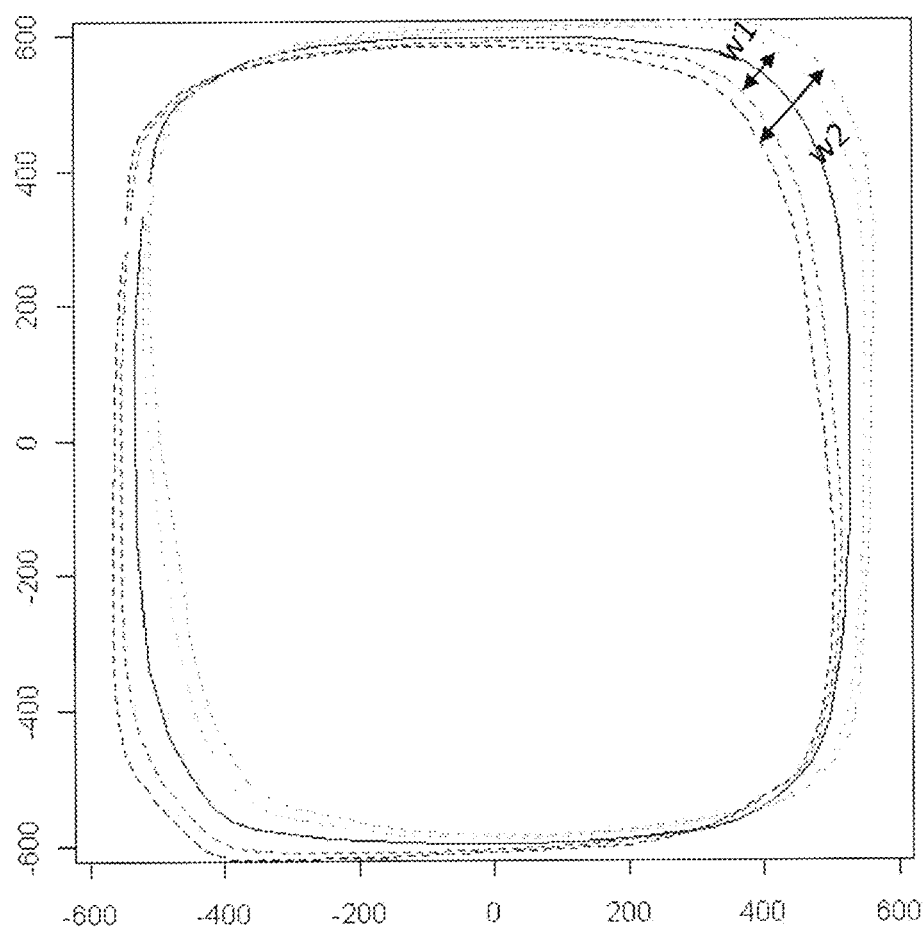
FIG. 8 is a schematic diagram illustrating shaped confidence intervals for mask features corresponding to a square target feature for discussing effects of the embodiments.

FIG. 8 shows a mean mask feature 431 in a photomask evaluated using shape information as discussed above. The statistical evaluation reveals that 90% of the actual mask features have outlines within a first strap S1 and 95% of the actual mask features have outlines within a second strap S2. This information may be more relevant to the user of the photomask than conventional CD information along two axes. The user may use the shape information to decide whether the photomask is used in a process for manufacturing micromechanical or semiconductor devices. Alternatively, the user may use the shape information to amend suitable optical proximity correction features that at least partly compensate for a variation pattern identified in a first photomask to produce a second photomask with a more realistic imaging pattern.

What is claimed is:

1. A method of manufacturing a photomask, the method comprising:
   forming a mask pattern including a critical mask feature on a photomask; and
   scanning or imaging the photomask to optically retrieve, from the photomask, shape information descriptive for an outline of the critical mask feature on the photomask, wherein the shape information contains position information identifying the positions of isolated landmarks on the outline relative to each other and wherein first ones of the landmarks indicate at least one of local curvature extrema, points of inflexion, sharp bends in the curvature and local curvature-change maxima in the outline of the critical mask feature, respectively.

2. The method of claim 1, further comprising:
   delivering the photomask in combination with the shape information.

3. The method of claim 2, further comprising:
   comparing the obtained shape information with reference shape information descriptive for a target shape of the critical mask feature with respect to a predetermined criterion.

4. The method of claim 3, further comprising:
   using the photomask for illuminating semiconductor wafers in the course of a semiconductor production process if the obtained shape information fulfills the predetermined criterion and, otherwise discarding or reworking the photomask.

5. The method of claim 1, further comprising:
   comparing the obtained shape information with reference shape information descriptive for a target shape of the critical mask feature with respect to a predetermined criterion.

6. The method of claim 1, wherein
   second ones of the landmarks are defined at predefined positions of the outline between neighboring first landmarks.

7. The method of claim 1, wherein first ones of the landmarks indicate at least one of zero-crosses and steps in a second derivative of the outline of the critical mask feature, respectively.

8. The method of claim 1, wherein the shape information contains mean shape information descriptive for a mean outline of a set of critical mask features assigned to a same target outline and statistical information on deviations of the critical mask features of the set from the mean outline.

9. The method of claim 8, wherein the critical mask features are in a productive portion of the photomask.

10. The method of claim 8, wherein the statistical information on deviations refers to the landmarks.

11. The method of claim 8, wherein the statistical information is based on a principal component analysis of the statistical information.

12. The method of claim 1, further comprising:

using the shape information in a method for optical proximity correction to obtain information describing optical proximity correction features suitable for enhancing a process window for a target feature on a semiconductor photomask, wherein the target feature corresponds to the critical mask feature.

13. A method of evaluating a photomask, the method comprising:

scanning or imaging the photomask to optically retrieve, from the photomask, shape information descriptive for an outline of a critical mask feature on the photomask, wherein the shape information contains position information identifying the positions of landmarks on the actual outline relative to each other; and defining the landmarks to indicate at least one of local curvature extrema, points of inflexion, sharp bends in the curvature and local curvature-change maxima in the outline of the critical mask feature, respectively.

* * * * *